United States Patent
Thompson et al.

(10) Patent No.: US 8,786,483 B1
(45) Date of Patent: Jul. 22, 2014

(54) USE OF A DLL TO OPTIMIZE AN ADC PERFORMANCE

(71) Applicants: Frederick Carnegie Thompson, Foynes (IE); Barry Stakely, Snow Camp, NC (US)

(72) Inventors: Frederick Carnegie Thompson, Foynes (IE); Barry Stakely, Snow Camp, NC (US)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/830,382

(22) Filed: Mar. 14, 2013

(51) Int. Cl.
*H03M 1/38* (2006.01)
(52) U.S. Cl.
CPC ...................................... *H03M 1/38* (2013.01)
USPC ............................ 341/161; 341/120; 341/163
(58) Field of Classification Search
CPC ........... H03M 1/38; H03M 1/40; H03M 1/42; H03M 1/44; H03M 1/46; H03M 1/0695
USPC .................................. 341/118, 120, 161–163
See application file for complete search history.

(56) References Cited

U.S. PATENT DOCUMENTS

| | | | | |
|---|---|---|---|---|
| 5,870,052 A | * | 2/1999 | Dedic et al. | 341/161 |
| 6,747,588 B1 | * | 6/2004 | Huang et al. | 341/156 |
| 8,344,925 B1 | * | 1/2013 | Evans | 341/155 |

OTHER PUBLICATIONS

Y. Jing et al., "A 1 GS/S 6 Bit 6.7 mW successive approximation ADC using asynchronous processing," IEEE J. Solid-State Circuits, vol. 45, No. 8, pp. 1469-1478, Aug. 2010.
S.-W. M. Chen et al., "A 6-bit 600-MS/s 5.3-mW Asynchronous ADC in 0.13-m CMOS," IEEE J. Solid-State Circuits, vol. 41, No. 12, pp. 2669-2680, Dec. 2006.
J. Craninckx et al., "A 65fJ Conversion-Step 0-to-50MSs 0-to-0.7mW 9b Charge-Sharing SAR ADC in 90nm Digital CMOS," in IEEE ISSCC Dig. Tech. Papers, Feb. 2007, pp. 246-600.
M. Yoshioka et al., "A 10-b 50-MS/s 820-W SAR ADC With On-Chip Digital Calibration," IEEE Trans. Biomed. Circuits and Syst., vol. 4, No. 6, pp. 410-416, Dec. 2010.

* cited by examiner

*Primary Examiner* — Khai M Nguyen
(74) *Attorney, Agent, or Firm* — Kenyon & Kenyon LLP

(57) ABSTRACT

Embodiments of the present invention may provide an improved apparatus and method for correcting timing errors associated with process, voltage, and temperature effects in asynchronous successive approximation register (SAR) analog-to-digital converters (ADC). A SAR ADC may include a timer comprising programmable timing circuits that may ensure that the different components of the SAR ADC are operating according to a timing scheme. Operation of the timing circuits may vary with process, voltage, and temperature, which may adversely affect the timing/accuracy of the SAR ADC. The ADC may include a reference circuit provided on the same integrated circuit as the SAR ADC that may provide a timing reference for the timing circuits. If the reference circuit indicates that the timing circuits are operating faster or slower than ideal, timing values within the timing circuits may be revised to compensate for such variations.

20 Claims, 4 Drawing Sheets

100

200

USE OF A DLL TO OPTIMIZE AN ADC PERFORMANCE

BACKGROUND

The present invention relates to analog-to-digital converters (ADCs). ADCs are utilized routinely in electronic devices to convert analog input voltages into corresponding digital signals for signal processing purposes. There are several types of ADCs such as pipeline ADCs, flash ADCs, and successive approximation register (SAR) ADCs.

SAR ADCs typically include a comparator, a SAR logic circuit, and a digital-to-analog converter (DAC). The converters use a successive approximation algorithm to iteratively convert a given analog input into a corresponding digital code. Each bit of the corresponding digital code is determined using a binary search algorithm. During the first iteration (or first bit trial), the SAR logic circuit sets a most significant bit (MSB) of an N-bit digital code to a value of 1 and transmits the code to the DAC. The DAC generates a corresponding analog voltage ($V_{DAC}$) based on the value of the code. The comparator then compares the voltage to be converted ($V_{IN}$) to $V_{DAC}$. The SAR logic circuit defines the value of the MSB based on the comparator's decision and stores this value in the SAR. This process is iteratively repeated for the remaining bits of the N-bit digital code and the resulting code is a digital approximation of $V_{IN}$.

A typical SAR ADC trialing cycle can be broken down into four successive phases: (1) DAC settling, (2) amplification, (3) comparator decision, and (4) SAR logic circuit response to comparator decision. ADCs typically implement delay circuits to allow adequate time for logic propagation/DAC settling and amplification to occur. However, these delay circuits vary with process, voltage, and temperature which can decrease the performance of the ADC. The problem is more prevalent when large a number of ADCs are on a single chip. Traditionally, to overcome these problems, the delay circuits were designed to provide fixed delays and to be immune to process, voltage, and temperature effects. However, utilizing fixed delays prevents optimization of the ADCs performance versus the ADC clock, or the ability to dynamically allocate more time to a portion of the conversion cycle that most limits the ADC performance.

The inventors therefore perceive a need in the art for an improved SAR ADC design to account for process, voltage, and temperature effects while maintaining design flexibility.

DETAILED DESCRIPTION

Embodiments of the present invention may provide an improved apparatus and method for correcting timing errors associated with process, voltage, and temperature effects in asynchronous successive approximation register (SAR) analog-to-digital converters (ADC). A SAR ADC may include a timer comprising programmable timing circuits that may ensure that the different components of the SAR ADC are operating according to a timing scheme. Operation of the timing circuits may vary with process, voltage, and temperature, which may adversely affect the timing/accuracy of the SAR ADC. The ADC may include a reference circuit provided on the same integrated circuit as the SAR ADC that may provide a timing reference for the timing circuits. If the reference circuit indicates that the timing circuits are operating faster or slower than ideal, timing values within the timing circuits may be revised to compensate for such variations.

Figure 1A:
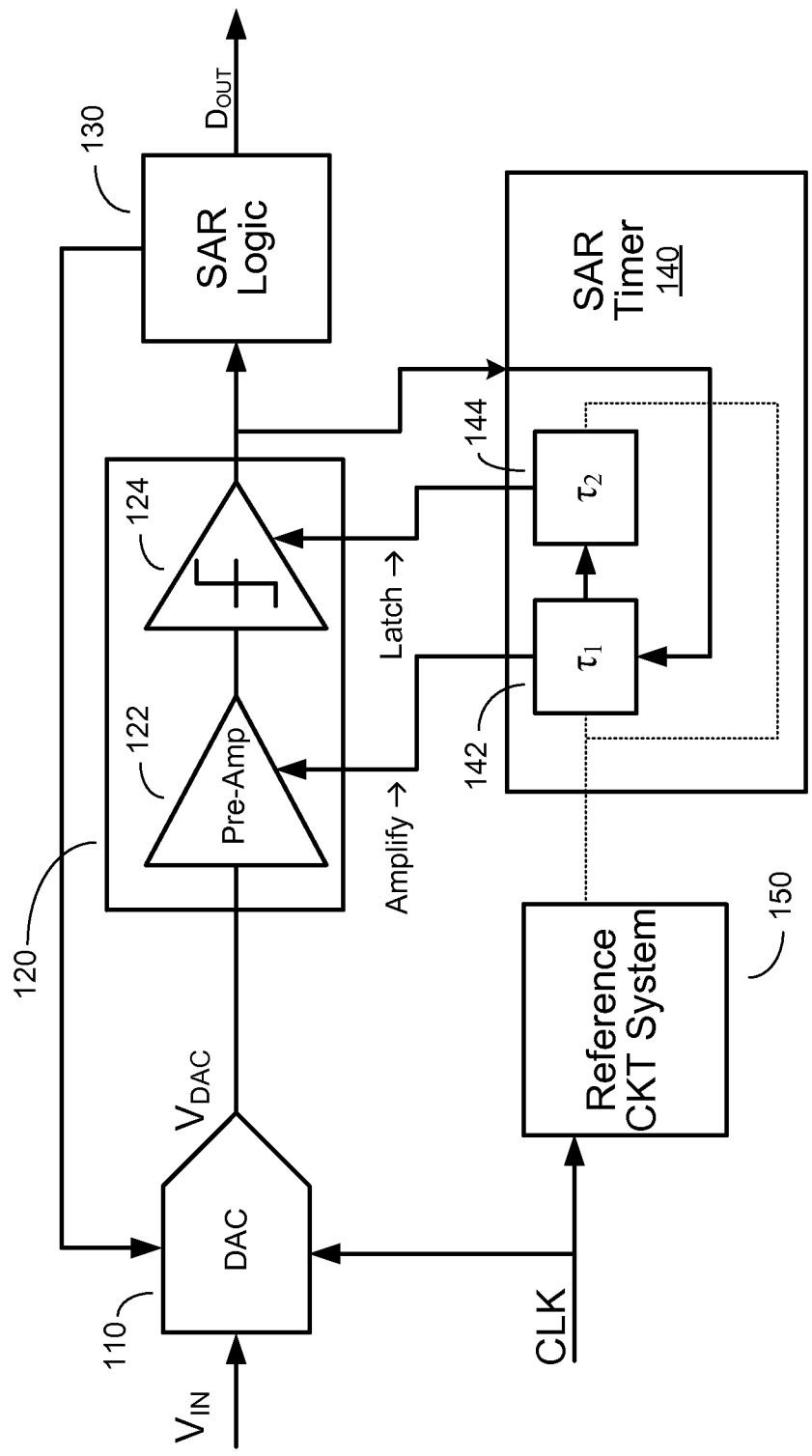
FIG. 1(a) is a block diagram of a SAR ADC according to embodiments of the present invention.

FIG. 1(a) is a simplified block diagram of a SAR ADC 100 according to an embodiment of the present invention. The SAR ADC 100 may include a digital to analog converter (DAC) 110, a comparator 120, a SAR logic circuit 130, a SAR timer 140, and a reference circuit system 150. The comparator's 120 input may be coupled to the output of the DAC 110. The comparator's 120 output may be coupled to the SAR logic circuit 130. The SAR logic circuit's 130 output may be coupled to the DAC 110. The SAR timer 140 may be coupled to the comparator 120. The reference circuit system 150 may be coupled to the SAR timer 140.

The SAR ADC 100 may accept an input voltage $V_{IN}$ to be digitized at an input of the DAC 110. The DAC 110, the comparator 120, and the SAR logic 130 may operate cooperatively to generate a digital code $D_{OUT}$ representing a value of the input voltage $V_{IN}$. The SAR ADC 100 may operate iteratively through a trial and error process in which the input voltage $V_{IN}$ is compared to a variety of test voltages representing different bit positions of a digital code. At the end of a given bit trial, the digital code generated thus far may be fed back within the SAR ADC 100 to generate a test voltage representing a next bit position of the digital code. The test voltage may be compared to the input voltage to generate a new bit position of the digital code. The SAR ADC 100 may test each bit position iteratively to generate a complete digital code representing the input voltage.

SAR ADCs 100 may be constructed according to a variety of architectures. In the embodiment illustrated in FIG. 1(a), the input voltage $V_{IN}$ may be input directly to a DAC 110. The DAC 110 may also include an input for the digital code $D_{am}$. The DAC 110 may include a variety of switched capacitors (not shown) that, responsive to the digital code, generate an output voltage $V_{DAC}$ having an amplitude equal to $V_{IN} - V_{TEST}$, where $V_{TEST}$ represents the test voltage being generated for a current bit trial. The comparator 120 may have a single input that compares the $V_{DAC}$ voltage to a reference value (say, ground) and develops a binary output representing the bit position under test.

SAR ADCs 100 may have other architectures, however. For example, although not shown, the comparator 120 may have a pair of inputs—a first input for the input voltage $V_{IN}$ and a second input for the test voltage $V_{TEST}$. In this configuration, the DAC 110 would generate the $V_{TEST}$ from the digital code provided by the SAR logic 130. The comparator 120 may compare the input voltage $V_{IN}$ to the test voltage $V_{TEST}$ and develop a binary output representing the bit position under test. For purposes of the present discussion, the architecture of the SAR ADC 100 is immaterial to the operation of the present invention unless mentioned herein.

The comparator 120 may include a pre-amplifier 122 and a latch 124. The pre-amplifier 122 may amplify the output signal of the DAC 110 prior to inputting the signal into the latch 124. The latch 124 may generate the comparator's 120 output signal from the amplified signal provided by the pre-amplifier 122.

The SAR timer 140 may control operation of the ADC 100. The SAR timer 140 may include a pair of programmable delay circuits 142, 144. A first delay circuit 142 may generate a first control signal to the pre-amplifier 122. A second delay circuit 144 may generate a second control signal to the latch 124. The first and second delay circuits 142, 144 may operate in cascaded operation from a common trigger signal provided by the comparator 120 output. Thus, once the trigger signal is activated, the first delay circuit 142 may generate its control signal at a predetermined delay thereafter. The second delay circuit 144 may generate the second control signal at a predetermined delay after completion of the first delay circuit 142. The first and second delay circuits 142, 144 may include registers (not shown) that store respective count values (or delay times) $T_1$ and $T_2$ that determine the amount of delay provided by each delay circuit 142, 144.

Figure 1B:
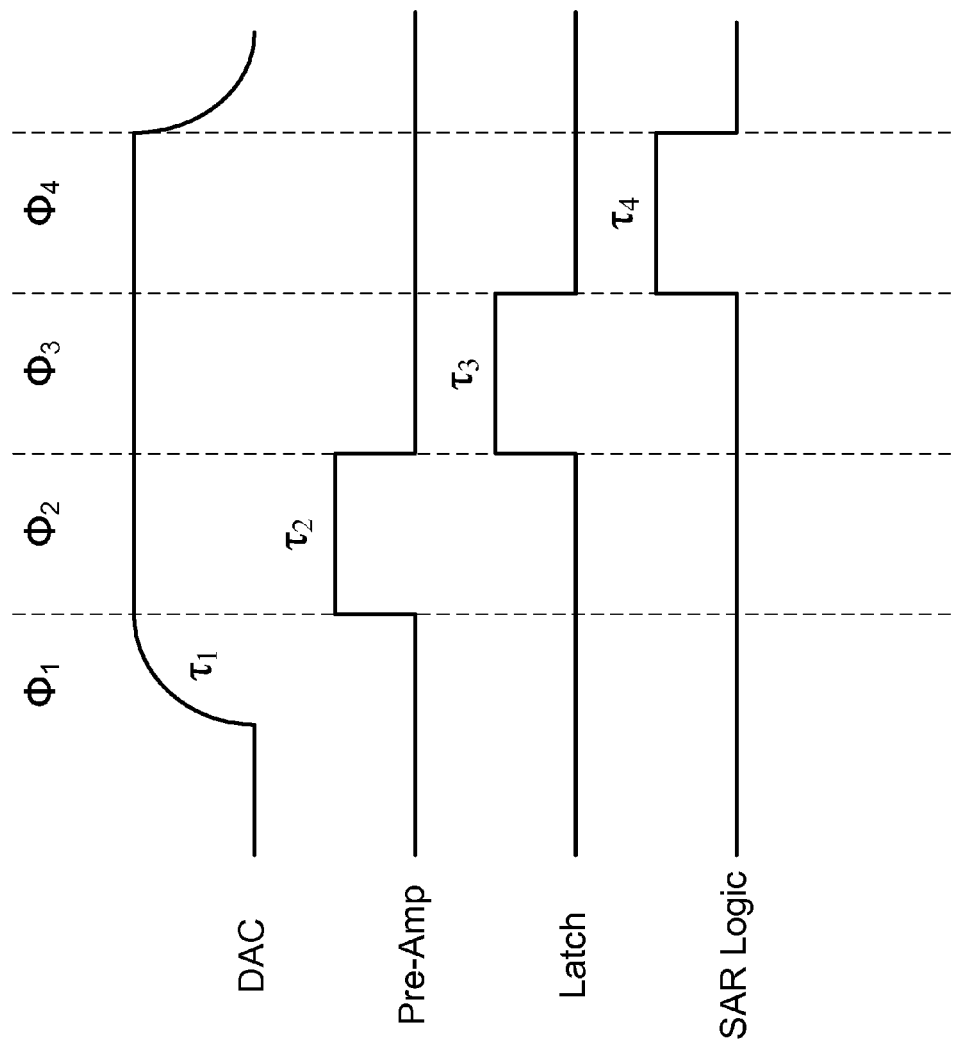
FIG. 1(b) is a timing diagram of a SAR ADC according to embodiments of the present invention.

FIG. 1(b) is a timing diagram of the SAR ADC 100's operation according to an embodiment of the present invention. The SAR ADC's 100 timing scheme (or trialing cycle) may include four successive phases $\phi_1$-$\phi_4$: (1) DAC 110 output signal settling phase $\phi_1$, (2) a pre-amplification phase $\phi_2$, (3) a latch 124 decision phase $\phi_3$, and (4) a SAR logic circuit 130 response to latch 124 decision phase $\phi_4$. The SAR timer 140 may control an amount of time (or count value) $T_1$-$T_4$ that each phase $\phi_1$-$\phi_4$ will be performed before another phase begins.

During operation, the delay circuit 142 may provide a control signal with a delay time of $T_1$ to delay the pre-amplifier's 122 operation until phase 0 is complete. Once phase 0 is complete (i.e., after the delay time $T_1$ elapses), pre-amplifier 122 may begin amplifying the received $V_{DAC}$ signal from the DAC 110. Subsequently, the delay circuit 144 may provide a delay signal with a delay time of $T_2$ to delay the latch's 124 decision operation until the pre-amplification phase $\phi_2$ is complete. After the delay time $T_2$ elapses, the latch 124 makes its decision during phase $\phi_3$ and outputs a high or low value to the SAR logic circuit 130 based on $V_{DAC}$. During phase $\phi_4$, the SAR logic circuit 130 may define the bits of the N-bit digital code based on the latch's 124 decision and supply the updated code to the DAC 110 for another iteration of the successive approximation algorithm.

According to embodiments of the present invention, SAR timer 140 may also provide control signals with delay times $T_3$ and $T_4$ to the SAR logic circuit 130 and the DAC 110, respectively, to control their operation times. The time delays $T_1$-$T_4$ may range from 100-200 picoseconds according to embodiments of the present invention.

Referring to FIG. 1(a), the reference circuit system 150 may act as a timing reference for the delay circuits 142 and 144 of the SAR timer 140. If the reference circuit system 150 indicates that the timing circuits are operating faster or slower than ideal (due to process, voltage, or temperature effects), the circuit system 150 may vary the delay counts $T_1$ and $T_2$ to ensure that the SAR ADC 100 is operating according to the timing scheme described in FIG. 1(b). An operation of an embodiment of the reference circuit system 150 will be described in further detail below.

Figure 2:
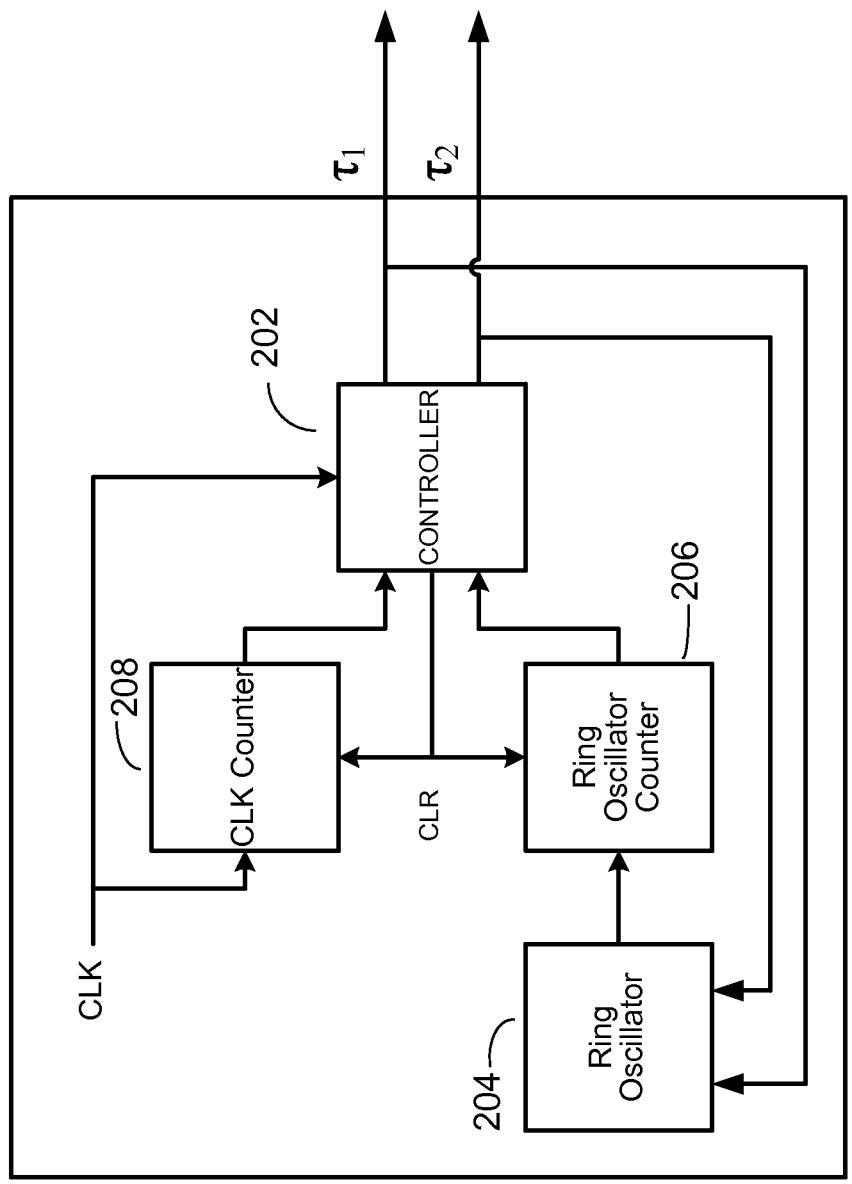
FIG. 2 is a block diagram a delay-locked loop integrated in a SAR ADC according to embodiments of the present invention.

FIG. 2 is a block diagram of a DLL 200, which is an example of the reference circuit system 150 of FIG. 1, that may be integrated into a SAR ADC according to embodiments of the present invention. The DLL 200 may include a controller 202, a ring oscillator 204 (i.e., a reference circuit), a ring oscillator counter 206, and a clock counter 208. The DLL 200 may calibrate count values (or delay times) $T_1$ and $T_2$ associated with programmable delay circuits (not shown, but similar to the delay circuits 142 and 144 in FIG. 1) in a SAR ADC based on a measured frequency of the DLL.

The ring oscillator 204 may be constructed of circuit components that are similar to the circuit components in the corresponding delay circuits. The ring oscillator 204 may output an oscillating signal to the ring oscillator counter 206, which may be incremented each time the oscillating signal transitions from a high value to a low value (and vice versa). The ring oscillator counter 206 may output a ring oscillator count value to the controller 202. A system clock signal CLK may simultaneously increment the clock counter 208 to provide a count of the system clock cycles to the controller 202. At a predetermined number of system clock cycles, the controller 202 may compare an actual ring oscillator 204 count value provided by the ring oscillator counter 206 to an expected (or ideal) count value. In other words, the controller 202 may compare an actual (or measured) frequency of the ring oscillator 204 to an expected frequency. The controller 202 may tune the components in the ring oscillator 204 until the actual frequency of the ring oscillator 204 is within a threshold range of the expected frequency. The controller may then calibrate the count values $T_1$ and $T_2$ associated with programmable delay circuits based on the tuning operation.

By way of example, a calibration operation on the programmable delay circuits 142 and 144 of FIG. 1 using the DLL 200 of FIG. 2 will be described below. The ring oscillator 204 may be constructed using components similar to those used to construct the delay circuits 142 and 144, allowing ring oscillator 204 to act as a reference circuit used to calibrate the delay circuits 142 and 144. In order to calibrate delay circuits 142 and 144, the controller 202 may monitor the actual frequency of ring oscillator 204. The controller 202 may compare the actual frequency of the ring oscillator 204 (affected process, voltage, and temperature) to an expected frequency and tune the components in the ring oscillator 204 until the actual frequency is within a threshold range of the expected frequency. Because the ring oscillator 204 and the delay circuits 142 and 144 may be made of similar components, the controller 206 may calibrate the programmable delay circuits 142 and 144 (by modifying the delay counts $T_1$ and $T_2$) based on a result of tuning the oscillator 204 to account for inaccuracies associated with process, voltage, and temperature. The controller 206 may transmit a clear signal CLR to the ring oscillator counter 206 and the clock counter 208 after the comparison is complete to clear them for another iteration of calibration.

According to other embodiments of the present invention, the ring oscillator 204 may act as a timing reference circuit for ADCs with various architectures. For example, some ADCs may include multiple conversion stages that blend SAR ADCs and flash ADCs. In those embodiments, the ring oscillator 204 may act as a timing reference circuit to calibrate flash delay circuits (which delay the operation of other components until the flash operation is complete), as well other suitable delay circuits.

Figure 3:
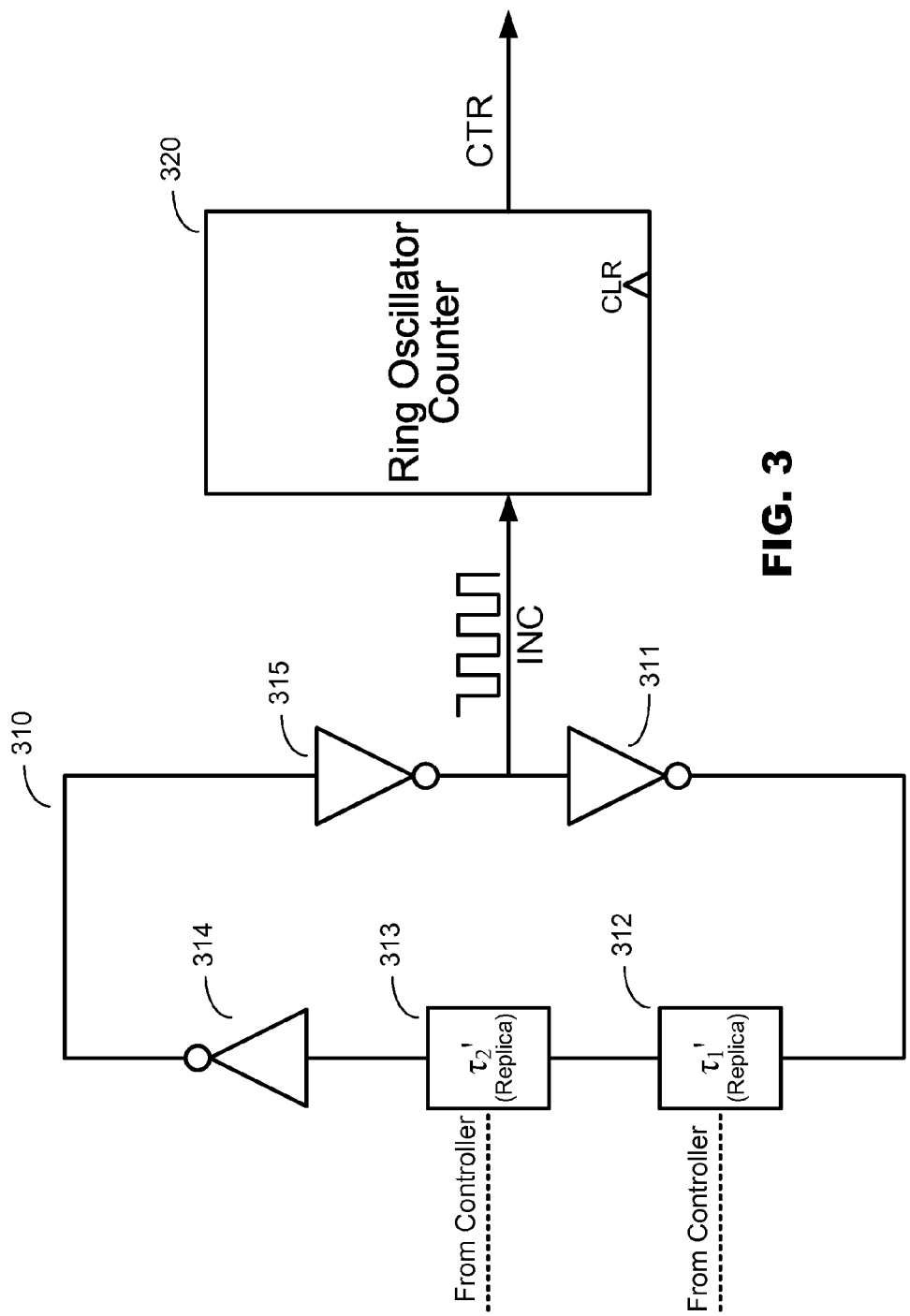
FIG. 3 is a block diagram of a ring oscillator and counter integrated in a SAR ADC according to embodiments of the present invention.

FIG. 3 is a block diagram of a ring oscillator 310 and a ring oscillator counter 320 that may be integrated in a reference circuit system (or DLL) of a SAR ADC according to an embodiment of the present invention. Ring oscillator 310 may act as a timing reference circuit for delay circuits in a SAR timer (not shown). By way of example, a calibration operation on the programmable delay circuits 142 and 144 (with delay times $T_1$ and $T_2$, respectively) of FIG. 1 using the ring oscillator 310 and the counter 320 of FIG. 3 will be described below.

Ring oscillator 310 may include inverters 311, 314, and 315 and replica delay circuits 312 and 313 coupled to each other in a loop configuration. The replica circuits 312 and 313 may be substantially similar to the delay circuits 142 and 144 and may include replica delay times $T_1'$ and $T_2'$ that are substantially similar to the delay times $T_1$ and $T_2$, respectively. Inverters 311, 314, and 315 may be made of the same type of transistors as the transistors in the replica circuits 312 and 313. For example, inverters 311, 314, and 315 may be made of n-type or p-type metal-oxide-semiconductors field effect transistors (MOSFETs). Although only three inverters 311, 314, and 315 are shown in FIG. 3, more or less inverters may be implemented depending on system requirements, as long are the loop includes an odd number of inverters. The counter 320 may store the number of times the output of inverter 315 switches from a high value (1) to a low value (0) and output a corresponding count value (CTR) to a controller (not shown, but similar to controller 202 in FIG. 2). The controller may vary the delay times $T_1'$ and $T_2'$ based on a count value of the oscillator 310

During operation, a signal with a value of 1 may be at the input into the inverter 311, which may output an inverted signal with a value of 0. The inverted signal with a 0 value may then be input into the replica circuit 312, which may output the signal with a 0 value after a replica delay time $T_1'$. Similarly, the signal with a 0 value may be input into the replica circuit 313, which may output the signal to the inverter 314 after a delay time $T_2'$. Due to the odd-number of inverters 311, 314, and 315, the ring oscillator 310 may output an increment signal INC that switches between high and low values every time the signal completes one loop. The counter 320 may monitor when the increment signal switches from high to low (and vice-versa) and may output a count value CTR to the controller.

At a given number of cycles of the system clock, the controller may compare the actual count value (i.e., affected by process, voltage, and temperature) of the ring oscillator 310 to an expected count value (i.e., if the delay times $T_1'$ and $T_2'$ were accurate and not affected by process, voltage, and temperature) of the ring oscillator 310. The controller may tune the replica circuits 312 and 313 (i.e., vary the replica delay times $T_1'$ and $T_2'$) until the actual count value of the ring oscillator 310 is within a threshold range of the expected count value. Because the replica circuits 312 and 313 in ring oscillator 310 and the corresponding delay circuits 142 and 144 may be substantially similar, the controller may use the tuned replica delay times $T_1'$ and $T_2'$ to calibrate the delay times $T_1$ and $T_2$ of the programmable delay circuits 142 and 144, respectively (i.e., set $T_1=T_1'$ and $T_2=T_2'$). The controller may transmit a clear signal CLR to the counter 320 after calibration is complete to clear the counter 320 for another iteration of calibration.

Although the foregoing techniques have been described above with reference to the SAR ADC configuration in FIG. 1, the invention is not limited to the above embodiments and the specific configurations shown in the drawings. For example, the foregoing techniques may apply to SAR ADC configurations that include a sample and hold amplifier (SHA) to receive an analog input signal and output it to a comparator. In such a configuration, a DAC may output a reference voltage directly into the comparator, which may compare the input voltage to the reference voltage and output a corresponding value based on the comparison. The techniques disclosed above may also apply to other suitable SAR ADC configurations, such hybrid flash/SAR ADCs and pipeline SARs (along with various other configurations not specifically mentioned in this description).

Moreover, some components in the embodiments described above may be combined with each other as another embodiment, or a component may be divided into several subcomponents, or any other known or available component may be added. Those skilled in the art will appreciate that these techniques may be implemented in other ways without departing from the spirit and substantive features of the invention. The present embodiments are therefore to be considered in all respects as illustrative and not restrictive.

We claim:

1. An integrated circuit comprising:
a successive approximation register (SAR) analog-to-digital converter (ADC) to convert an analog input signal into a digital signal;
a SAR timer comprising a pair of programmable timing circuits, a first timing circuit to delay an amplification phase of the SAR ADC during operation and a second timing circuit to delay a latch phase of the SAR ADC during operation;
a reference circuit system to act as a timing reference for the programmable timing circuits and calibrate each programmable timing circuit if they are operating faster or slower than expected.

2. The circuit of claim 1, wherein the reference circuit comprises a delay locked loop (DLL) comprising:
a ring oscillator circuit;
a counter to count an actual frequency of the ring oscillator; and
a controller programmed to compare the actual frequency of the ring oscillator to an expected frequency of the ring oscillator and calibrate the first and second timing circuits based on the comparison.

3. The circuit of claim 2, wherein the ring oscillator circuit comprises an odd-number of inverters and replicas circuits of the first and second timing circuit in a loop configuration, wherein the inverters are made of the same type of transistors as the first and second timing circuits.

4. The circuit of claim 3, wherein the controller:
tunes the replica circuits until the actual frequency of the ring oscillator is within a threshold range of the expected frequency; and
calibrates the first and second timing circuits based on a result of the tuning of the replicas circuits.

5. The circuit of claim 1, wherein:
the SAR ADC includes a flash component and the SAR timer comprises a third programmable timing circuit to account for a flash delay; and
the reference circuit system calibrates the third timing circuit.

6. The circuit of claim 1, wherein the SAR timer further comprises a plurality of programmable timing circuits associated with corresponding phases of operation and the reference circuit system acts as a timing reference for each timing circuit to calibrate the respective timing circuits.

7. The circuit of claim 1, where in the SAR ADC comprises:
a sample and hold amplifier to sample the input signal;
a digital-to-analog converter (DAC) to receive an N-bit digital code from a SAR logic circuit and generate a corresponding analog reference signal; and
a comparator to compare the sampled input signal to the reference signal and output a value depending on the comparison, wherein
the SAR logic circuit is programmed to modify the N-bit digital code based on the comparator's output.

8. A converter, comprising:
a multi-stage converter system to digitize an input voltage,
a control system having a plurality of timers, each timer operating according to a respective count value defining an operation time for an associated stage of the converter system, a timing reference system having a local oscillator, and a controller to compare an actual operational speed of the local oscillator to an expected operational speed and, based on the comparison, to adjust the timer count values.

9. The converter of claim 8, wherein:

the oscillator comprises an odd-number of inverters and a replica circuit for each timer in a loop configuration, wherein the inverters are made of the same type of transistors as the timer.

10. The converter of claim 9, wherein the controller:

tunes the replica circuits until the actual operational speed of the oscillator is within a threshold range of the expected operational speed; and adjusts the timer count values of the timers based on a result of the tuning of the replica circuits.

11. The converter of claim 8, wherein the multistage converter system is a successive approximation register (SAR) analog-to-digital converter (ADC).

12. The converter of claim 11, wherein:

the SAR ADC comprises a converter with a pre-amplifier and a latch;

the stages comprise a pre-amplifier stage and a latch stage; and the timers comprise a first timer associated with the pre-amplifier stage and a second timer associated with the latch phase.

13. The converter of claim 11, wherein the SAR ADC comprises a sample and hold amplifier.

14. The converter of claim 8, wherein the multistage converter system comprises a flash analog-to-digital converter (ADC).

15. The converter of claim 8, wherein the timing reference system comprises a counter to measure the actual operational speed of the oscillator.

16. A method comprising:

providing a delay-locked loop (DLL) on the same integrated circuit as a successive approximation register (SAR) analog-to-digital converter (ADC), wherein the SAR ADC comprises programmable timing delay circuits and the DLL comprises a local oscillator comprising a replica circuit of each timing delay circuit;

comparing an actual frequency of the oscillator to an expected frequency and calibrating the timing delay circuits based on the comparison.

17. The method of claim 16, wherein:

the ring oscillator further comprises an odd-number of inverters in a loop configuration with the replica circuits, wherein the inverters are made of the same type of transistors as the timing delay circuits; and the DLL further comprises a counter to generate a counter signal representing the actual frequency of the ring oscillator.

18. The method of claim 16, further comprising:

tuning the replica circuits until the actual frequency of the oscillator is within a threshold range of the expected frequency; and tuning the timing delay circuits based on the result of the tuning of the replica circuits.

19. The method of claim 16, wherein the SAR ADC comprises:

a digital-to-analog converter (DAC) to sample and hold an analog input voltage, receive an N-bit digital code from a SAR logic controller and generate a corresponding analog reference voltage, and provide a DAC voltage representing a difference between the analog input voltage and the reference voltage; and a comparator to output a value based on the DAC voltage, wherein the SAR logic controller is programmed to modify the N-bit digital code based on the comparator's output.

20. The method of claim 19, wherein the timing delay circuits account for a DAC settling time and a comparator pre-amplification time.

* * * * *